(12) United States Patent  (10) Patent No.: US 8,044,674 B2
Zanardi et al.  (45) Date of Patent: Oct. 25, 2011

(54) SEMICONDUCTOR DEVICE WITH THERMAL FAULT DETECTION

(75) Inventors: Alberto Zanardi, Villach (AT); Erich Scheikl, Villach (AT); Robert Illing, Villach (AT); Herbert Hopfgartner, Lieserbruecke (AT)

(73) Assignee: Infineon Technologies AG, Neubiberg (DE)

( * ) Notice: Subject to any disclaimer, the term of this patent is extended or adjusted under 35 U.S.C. 154(b) by 194 days.

(21) Appl. No.: 12/613,761

(22) Filed: Nov. 6, 2009

(65) Prior Publication Data

US 2011/0109372 A1  May 12, 2011

(51) Int. Cl.
*G01R 31/3187* (2006.01)
(52) U.S. Cl. .................................... 324/750.3
(58) Field of Classification Search ........... 324/762.01–762.09, 750.01, 750.03, 324/750.05–750.06, 750.11, 750.3, 754.07; 257/48; 438/14–18; 714/724
See application file for complete search history.

(56) References Cited

U.S. PATENT DOCUMENTS 5,625,288 A * 4/1997 Snyder et al. ............ 324/750.06
7,268,575 B1 * 9/2007 Chen et al. ............... 324/762.09
* cited by examiner

*Primary Examiner* — Jermele M Hollington
*Assistant Examiner* — Tung X Nguyen
(74) *Attorney, Agent, or Firm* — Slater & Matsil, L.L.P.

(57) ABSTRACT

A semiconductor device with a thermal fault detection is disclosed. According to one example of the invention such a semiconductor device includes a semiconductor chip including an active area. It further includes a temperature sensor arrangement that provides a measurement signal dependent on the temperature in or close to the active area, the measurement signal having a slope of a time-dependent steepness, and an evaluation circuit that is configured to provide an output signal that is representative of the steepness of the slope of the measurement signal and further configured to signal a steepness higher than a predefined threshold.

16 Claims, 3 Drawing Sheets

US 8,044,674 B2

SEMICONDUCTOR DEVICE WITH THERMAL FAULT DETECTION

TECHNICAL FIELD

The present invention relates to the field of semiconductor devices and methods for operating such devices, especially to power semiconductor devices including a fault detection capability for detecting faulty operating states that lead to a rise in temperature such as, for example, short circuits.

BACKGROUND

Semiconductor devices, especially power semiconductor devices such as power semiconductor switches often include a temperature measurement functionality for detecting faulty or undesired mode of operations during which undesirably high temperatures may occur. Such faulty or undesired mode of operations may be, inter alia, an over-load, or a short circuit.

Power semiconductor switches capable of detecting over-temperature, over-load, short-circuits, etc., are often referred to as "smart power switches." In known applications temperature is often measured at two positions, namely one temperature sensor measures the temperature in or close to the active area of the semiconductor device (e.g., of the DMOS switch) and another sensor measures the temperature in or close to the coldest area of the chip. The difference between these two temperature measures may be used to assess the state of the semiconductor device. That is, if the temperature difference exceeds a predefined threshold value or if one temperature measure exceeds a maximum allowable temperature, then the semiconductor device is powered down in order to avoid damage to the device.

In known applications the above mentioned thresholds are predefined constants. The semiconductor device is powered down, for example, when the measured temperature difference exceeds a threshold of 60 Kelvin. However, following such an approach it may be difficult to distinguish a faulty mode of operation (such as a short circuit) from a temperature rise due to ordinary operation with in a sufficiently short period of time. This may be particularly the case when operating at high (battery) supply voltages, that is above about 12 to 15 volts.

Thus there is a need for a thermal fault detection within semiconductor devices that allow for a fast detection of faulty operating states which lead to an undesired rise of temperature.

SUMMARY OF THE INVENTION

A semiconductor device with a thermal fault detection is disclosed. According to one example of the invention such a semiconductor device comprises a semiconductor chip including an active area. It further comprises a temperature sensor arrangement that provides a measurement signal dependent on the temperature in or close to the active area, the measurement signal having a slope of a time-dependent steepness, and an evaluation circuit that is configured to provide an output signal that is representative of the steepness of the slope of the measurement signal and further configured to signal a steepness higher than a predefined threshold.

Further, a method for operating a semiconductor device that comprises a semiconductor chip including an active area is disclosed. Accordingly, another example of the invention relates to a method which comprises: providing a measurement signal dependent on the temperature in or close to the active area, the measurement signal having a slope of a time-dependent steepness; evaluating the measurement signal to provide an output signal that is representative of the steepness of the slope of the measurement signal; and signaling a faulty state of operation of the semiconductor device if the steepness of the slope of the measurement signal is higher than a predefined threshold.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

For the following detailed description of the invention a smart power semiconductor switch is used as a concrete example for an arbitrary semiconductor device. However, the fault detection explained below with reference to the semiconductor switch may also be applied to other semiconductor devices other than power switches.

Figure 1:
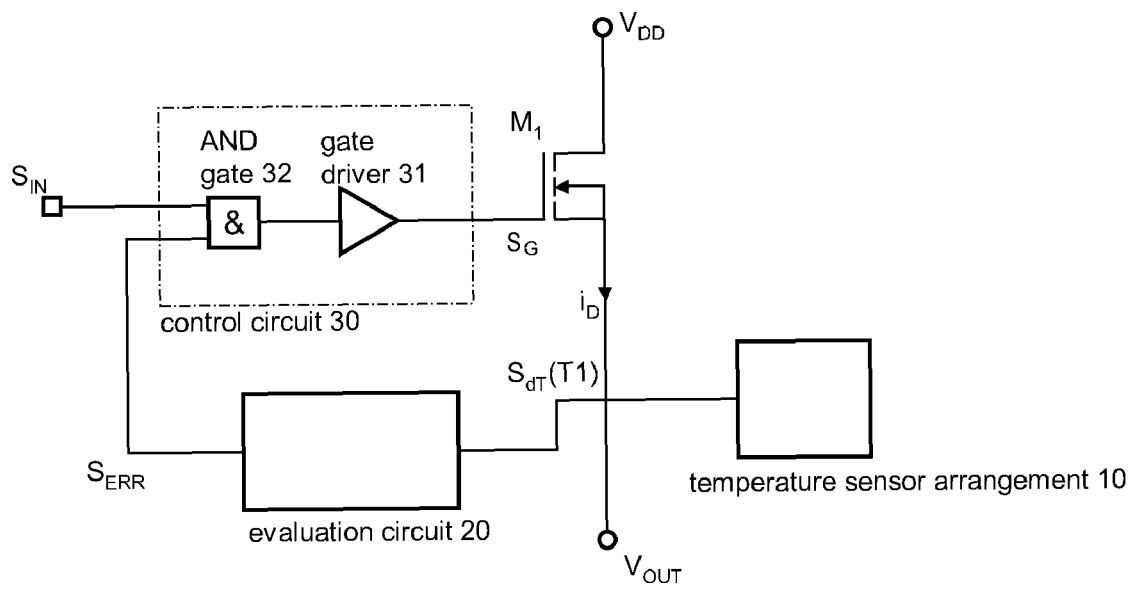
FIG. 1 illustrates a smart power switch by means of a block diagram as one example for a semiconductor device according to the invention.
Figure 2:
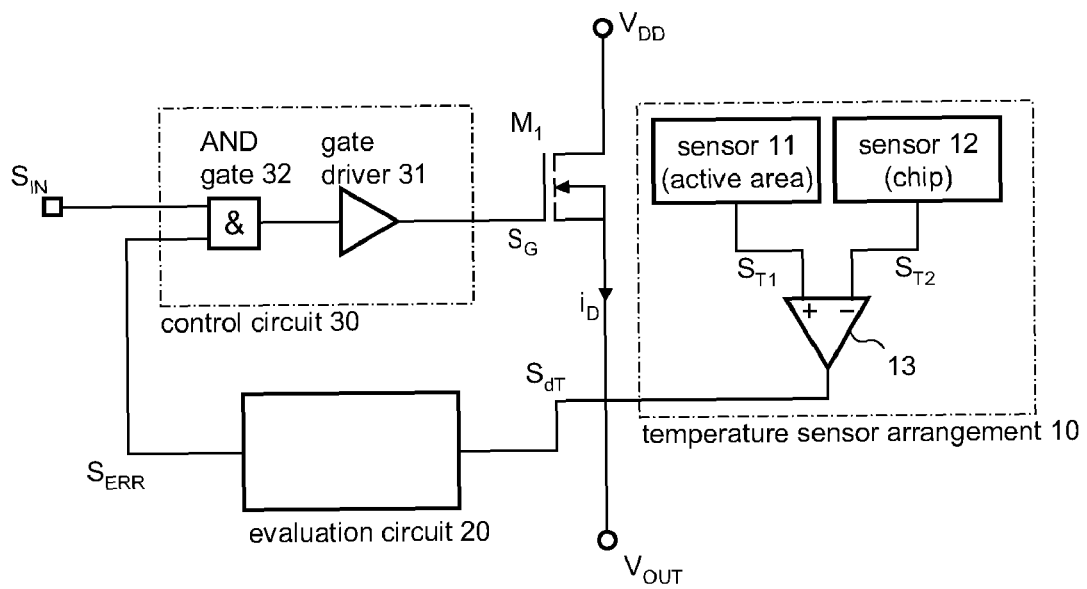
FIG. 2 illustrates a modified version of the example of FIG. 1.

In FIGS. 1 and 2, examples for a semiconductor device with a thermal fault detection is illustrated by means of a circuit diagram. The semiconductor device depicted in FIG. 1 comprises a semiconductor switch $M_1$ integrated in a semiconductor chip. The semiconductor chip includes an active area which is the area that forms the current path between the load electrodes of the semiconductor switch. In other words, the active area is the region where electrical power is dissipated and converted into thermal power which leads to a rise in temperature during operation of the semiconductor device. The semiconductor switch $M_1$ is depicted as a DMOS transistor. However, any other type of electronic switch could be used.

The semiconductor device further comprises a temperature sensor arrangement 10 that provides a measurement signal $S_{dT}$ dependent on the temperature $T_1$ in or close to the active area of the semiconductor chip (see FIG. 1). The measurement signal having a slope of a time-dependent steepness (i.e. a time-varying gradient) whose relevance for the fault detection is described below. The semiconductor devise also comprises an evaluation circuit that is configured to provide an output signal that is representative of the steepness of the slope (i.e., of the gradient) of the measurement signal $S_{dT}$ and is further configured to signal a steepness (i.e., a gradient value) which is higher than a predefined threshold. If the threshold is exceeded, an error signal $S_{ERR}$ may be set to a logic level indicative of an faulty state of operation. In other words, the gradient of the measurement signal is used to assess whether the semiconductor device is in a faulty state of operation or, alternatively, in a normal state of operation.

According to the example of the invention illustrated in FIG. 2, the temperature sensor arrangement 10 may comprise two temperature sensors. A first temperature sensor 11 is arranged such to provide a first temperature signal $S_{T1}$ representative of a temperature $T_1$ present at the active area, whereas a second temperature sensor 12 is arranged such to provide a second temperature signal $S_{T2}$ representative of a chip temperature $T_2$ present remote from the active area of the semiconductor chip. The temperature sensors may be integrated in the same semiconductor chip as the transistor $M_1$ (and thus the active area). However, when using chip-on-chip or chip-by-chip technology one of the temperature sensors 11, 12 as well as other parts of the circuit shown in FIGS. 1 and 2 may be integrated in one or more separate chips. The temperature sensor arrangement 10 may further comprise a subtracting unit 13 that is configured to provide a signal representative of a difference dT between the first and the second temperature $T_1$, $T_2$ as the measurement signal $S_{dT}$. In this case the measurement signal $S_{dT}$ can be interpreted as a relative temperature with respect to the chip temperature $T_2$ provided by the second temperature sensor 12.

In most cases the first temperature sensor 11 may be integrated in the same semiconductor chip as the transistor $M_1$ and close to the active area. For example, in the case of a MOSFET transistor as semiconductor switch $M_1$ the intrinsic reverse diode of the transistor may be used as a temperature sensor. However, the temperature coefficient of silicon may also be used for temperature measurement. The second temperature sensor 12 is arranged such to measure an average chip temperature. It has therefore to be arranged remote from the active region close to the coldest part of the chip. This sensor 12 may also be integrated in a separate chip as mentioned above. According to the present example of the invention the gradient of the relative temperature dT is used to assess whether the semiconductor device is in a faulty state of operation or not.

In order to protect the semiconductor device and other devices connected thereto from damage, a control circuit 30 may be provided that is configured to deactivate and/or to power down the semiconductor device in case the evaluation circuit 20 assesses the measurement signal $S_{dT}$ as "abnormal" and thus signals a faulty state of operation to the control circuit 30. In the present example, where the considered semiconductor device is a smart power switch, the control circuit 30 may comprise a gate driver 31 for generating a driver signal $S_G$ provided to a control electrode (e.g., a gate electrode) of the semiconductor switch. The driver signal $S_G$ is set in accordance with an input signal $S_{IN}$ provided to the control circuit 30 and thus to the gate driver 31. To ensure the above-mentioned deactivate or power-down function a gate circuit 32 may be used that blanks the input signal $S_{IN}$ thus forcing the gate driver 31 to generate a driver signal $S_G$ that causes a switch-off of the transistor $M_1$.

Figure 3:
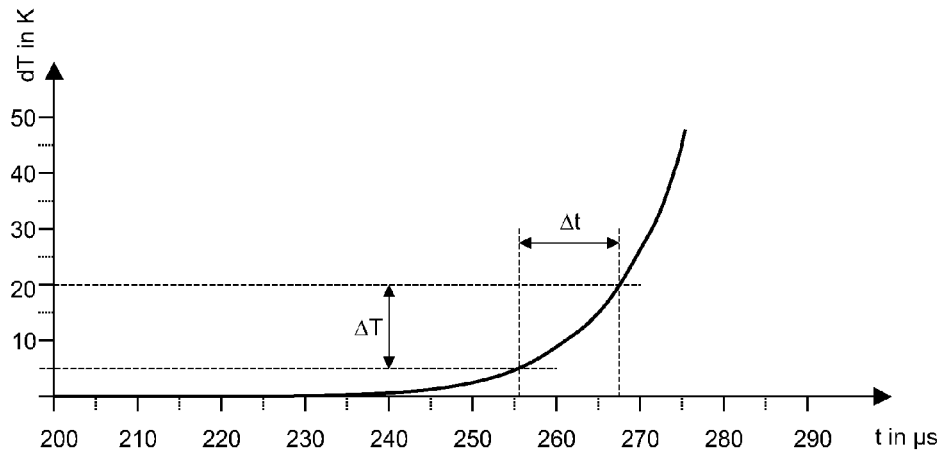
FIG. 3 illustrates the function of the fault detection according to one example of the invention in a timing diagram that shows the temperature rise over time in a semiconductor device connected to a short-circuited load.

The thermal fault detection functionality of the semiconductor device illustrated in FIGS. 1 and 2 is discussed in more detail below with reference to FIGS. 3, 4 and 5. The smart power switch illustrated in FIGS. 1 and 2 may be used to switch on and off a load (not shown in FIGS. 1 and 2) connected between a first load terminal of the semiconductor switch $M_1$ (e.g., source terminal in case of a MOS transistor) and a lower supply potential, for example, ground potential, whereas a second load terminal (e.g., drain terminal) of the semiconductor switch $M_1$ is supplied with a high supply potential $V_{DD}$. In such a configuration the semiconductor switch operates as a high-side switch.

Assuming the load is short-circuited, then the output voltage $V_{OUT}$ present at the second load terminal of the transistor $M_1$ is close to ground potential and the load current $i_D$ (e.g., drain current) is mainly limited by the on-resistance of the transistor $M_1$. It is clear that in such a state of operation the semiconductor device will be quickly overheated and thermally destroyed unless the device is powered-down quickly before the temperature rises above a critical value. FIG. 3 illustrates by means of a timing diagram the rise of the relative temperature dT over time t in the semiconductor device when connected to a short-circuited load.

In case of a short-circuited load the temperature of the active area of the semiconductor chip rises quickly. To give an example, FIG. 3 illustrates the rise of the relative temperature (represented by the measurement signal $S_{dT}$) over time. The relative temperature dT is measured in Kelvin (abbreviated as K) whereby zero Kelvin (0K) represents the chip temperature $T_2$ measured by the second sensor 12 (see FIG. 2). The relative temperature starts to increase very shortly after the short circuit (approximately at t=230 μs). At a time t=256 μs the temperature dT exceeds a 5K threshold and a time period of Δt=12 μs later, at a time t=268 μs the temperature dT exceeds a 20K threshold. The temperature difference between the two thresholds dT=5K and dT=20K is denoted with the symbol ΔT. Thus the gradient of the measurement signal $S_{dT}$ within the time interval [256 μs, 268 μs] can be approximated by ΔT/Δt which represents the average steepness of the slope of the measurement signal $S_{dT}$ within the considered time interval. When considering the gradient of the measurement signal (or an average gradient as an approximation thereof) in the assessment of the measurement signal a faulty state of operation (e.g., a short circuit) may be detected early before the temperature rises above a critical temperature $dT_{CRIT}$ which may be, for example, about 60K. A consideration of the gradient is useful since, when the critical temperature $dT_{CRIT}$ is once exceeded, it may be too late for an emergency shutdown of the semiconductor device.

To obtain a measure for the gradient of the measurement signal $S_{dT}$ the evaluation circuit may be configured to evaluate a rise time Δt that it takes the measurement signal $S_{dT}$ to rise by a predefined temperature increment ΔT (e.g., from $S_{REF1}$=5K to $S_{REF2}$=20K) and to signal (error signal $S_{ERR}$) a faulty state-of-operation when the rise time Δt is below a predefined threshold. Alternatively, the evaluation circuit may be configured to evaluate an increment ΔT that the measurement signal $S_{dT}$ rises within a predefined time period Δt (e.g., 20 μs) and to signal a faulty state of operation when the temperature increment ΔT is above a predefined threshold. In the first case the time measurement can be triggered when the measurement signal exceeds a first temperature threshold (e.g., $S_{REF1}$=5K) and stopped when the measurement signal exceeds a second temperature threshold (e.g., $S_{REF2}$=20K). In the second case the temperature increment ΔT has to be continuously evaluated in subsequent time periods Δt to detect a faulty condition.

Figure 4:
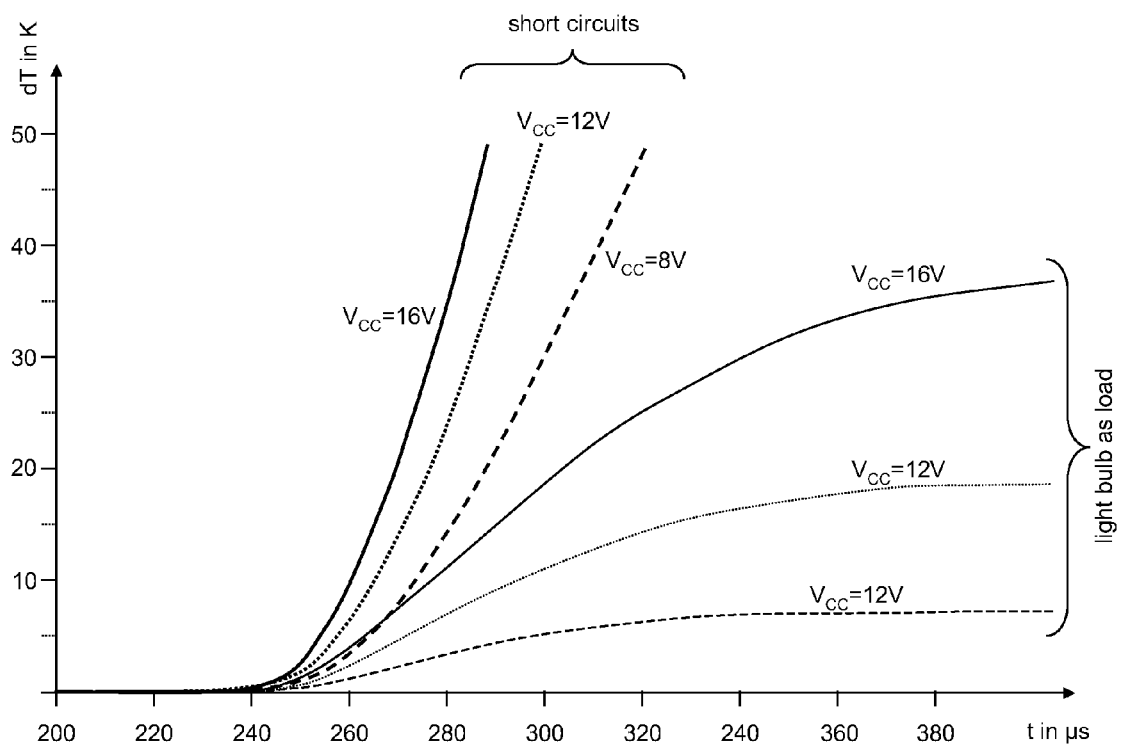
FIG. 4 illustrates in another timing diagram the temperature-over-time characteristics of a semiconductor device according to FIG. 1 in various states of operation.

FIG. 4 illustrates the temperature-over-time characteristics for various supply voltages $V_{CC}$ and different loads (short-circuit as overload, light bulb as normal load) to allow a comparison of the resulting temperature measurement signals $S_{dT}$ and, respectively, the corresponding relative temperatures dT. The solid lines refer to measurements using a supply voltage of $V_{CC}$=16V, the dotted lines to measurements using a supply voltage of $V_{CC}$=12V, and finally the dashed lines to measurements using a supply voltage of $V_{CC}$=8V. The thick lines refer to measurements with a short-circuited load whereas the thin lines refer to measurements with a light bulb as a "normal" load. It can be seen from FIG. 4 that, when a short-circuited load is connected to the semiconductor device, the relative temperature dT of the active area of the semiconductor chip rises about twice as fast as is the case when a light bulb is connected as a load. The steepness of the slope can be detected quickly after activating the semiconductor device (e.g., after switching on the semiconductor switch) and the short-circuit may be detected before the temperature dT exceeds the a predefined maximum value (which may be about 60K in the present example).

Figure 5:
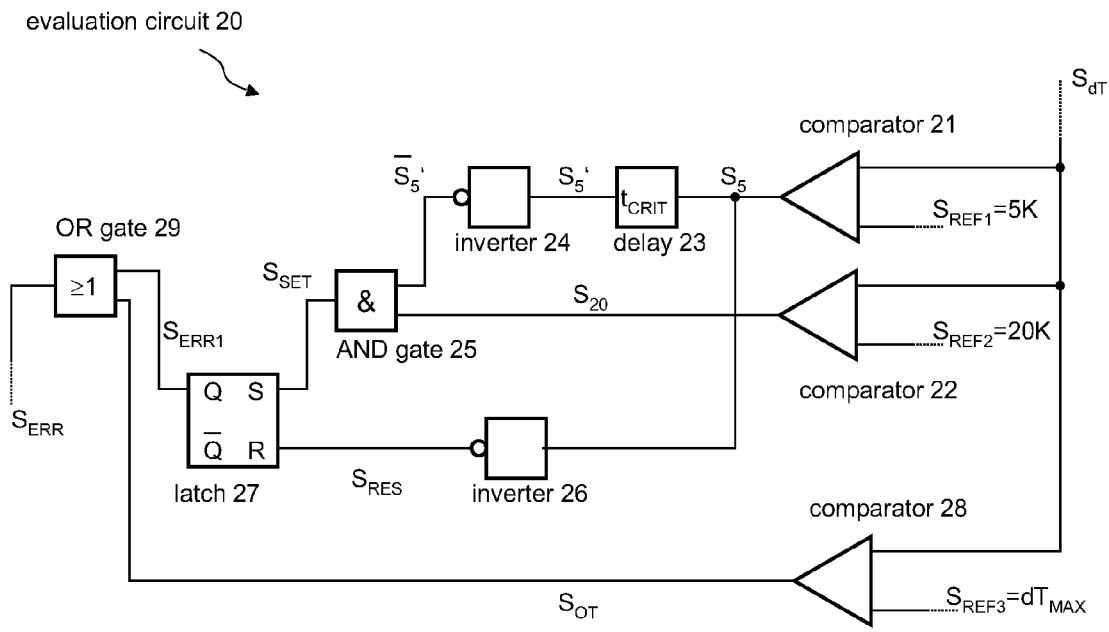
FIG. 5 illustrates one example of an evaluation circuit included in a semiconductor device according to FIG. 1 and providing the fault detection functionality.

FIG. 5 illustrates an example of one possible implementation of the evaluation circuit 20 (see FIGS. 1 and 2). A skilled person will realize that the functionality provided by the evaluation circuit 20 as explained above can be implemented in various different ways either using designated or using generic hardware running an appropriate software.

In the example of FIG. 5 the evaluation circuit 20 receives the measurement signal $S_{dT}$ that is representative of the relative temperature dT of the active area of the semiconductor chip. The measurement signal $S_{dT}$ is supplied to a first comparator 21 and a second comparator 22, where the first comparator 21 has a switching first threshold $S_{REF1}$ of, for example, 5K and the second comparator has a second switching threshold $S_{REF2}$ of, for example, 20K. The (digital) output signals of the comparators 21 and 22 are denoted with $S_5$ and $S_{20}$, respectively. The signals $S_5$ and $S_{20}$ assume a first logic level (a high level in the present example), if the measurement signal $S_{dT}$ is above the first threshold $S_{REF1}$ or the second threshold $S_{REF2}$, respectively, and assume a second logic level (a low level in the present example) if the signals $S_5$ and $S_{20}$ are below the respective threshold. If the semiconductor device operates on a short-circuited load, the signal $S_5$ will switch from a low to a high level when the relative temperature dT exceeds the 5K threshold and the signal $S_{20}$ will switch from a low to a high level a time period Δt later when the relative temperature dT exceeds the 20K threshold (see also FIG. 3). In other words, if the temperature dT rises, the edge in signal $S_5$ will occur at time Δt before the corresponding edge occurs in signal $S_{20}$. The period Δt is the time it takes the measurement signal $S_{dT}$ to rise from the first threshold $S_{REF1}$ to the second threshold value $S_{REF2}$.

The evaluation circuit 20 thus performs the following tasks:

(1) receiving the measurement signal $S_{dT}$;

(2) comparing the measurement signal $S_{dT}$ with a first threshold $S_{REF1}$ that is representative of a first temperature (5K in the present example);

(3) signaling (by a rising edge in signal $S_5$ in the present example) when the measurement signal $S_{dT}$ exceeds a first threshold $S_{REF1}$;

(4) comparing the measurement signal $S_{dT}$ with a second threshold $S_{REF2}$ that is representative of a second temperature (20K in the present example); and (5) signaling (by a rising edge in signal $S_{20}$ in the present example) when the measurement signal $S_{dT}$ exceeds a second threshold $S_{REF2}$.

If the time difference Δt between the time when the measurement signal $S_{dT}$ exceeds a first threshold $S_{REF1}$ and the time when the measurement signal $S_{dT}$ exceeds a second threshold $S_{REF2}$ is shorter than a predefined critical time period $t_{CRIT}$ then the slope of the measurement signal (i.e., the gradient) is too steep and it can be concluded, that the semiconductor device is in a faulty state of operation. Thus the evaluation circuit 20 further performs the tasks of (6) comparing the time difference Δt with a predefined critical time period $t_{CRIT}$; and (7) signaling a faulty state of operation if the time difference Δt is shorter than the critical time period $t_{CRIT}$.

Many possibilities exist in digital electronics for comparing a time period with a reference time period. In the present example the signal $S_5$ which signals the start of the time period Δt is delayed (delay element 23) by the critical time $t_{CRIT}$ and the resulting delayed signal $S_5'$ is inverted (inverter 24). The inverted and delayed signal NOT $S_5'$ and the signal $S_{20}$ which signals the end of the time period Δt are supplied to an AND gate 25 whose output is only active (i.e., at a high level) for a time $t_{CRIT}$-Δt if the time period Δt is shorter than the critical time period $t_{CRIT}$. In this case the output of the AND gate 25 sets an RS-latch 27 whose output signals the detected short circuit by generating an output signal $S_{ERR1}$ at its output Q. In principle, this output signal $S_{ERR1}$ could be used to trigger the deactivation or powering-down of the semiconductor device in order to protect it from damage. The RS-latch 27 is not reset (with the help of inverter 26) before the signal $S_5$ falls below the first threshold $S_{REF1}$ again, that is not before the relative temperature falls under the 5K threshold.

Additionally, another criterion for an emergency shut-down may be the relative temperature dT increasing a maximum allowable temperature $dT_{MAX}$. In order to provide this function the evaluation circuit 20 may comprise a third comparator 28 for comparing the measurement signal $S_{dT}$ with a third threshold $S_{REF3}$ that is representative for the maximum allowable temperature $dT_{MAX}$. The output of the third comparator 28 provides an over-temperature signal $S_{OT}$ which may be combined with the output signal $S_{ERR1}$ of the RS-latch 27 by an OR gate 29 which provides the evaluation result signal $S_{ERR}$ indicating a faulty state of operation of the semiconductor device either when the temperature gradient is above a predefined limit (defined by the critical time period $T_{CRIT}$) or when the relative temperature dT increases above a critical maximum value $dT_{MAX}$.

Although the present invention and its advantages have been described in detail, it should be understood that various changes, substitutions, and alterations can be made herein without departing from the spirit and scope of the invention as defined by the appended claims. For example, it will be readily understood by those skilled in the art that the voltages and polarities may be altered while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a semiconductor chip including an active area;
   a temperature sensor arrangement that provides a measurement signal dependent on a temperature in or close to the active area, the measurement signal having a slope of a time-dependent steepness; and
   an evaluation circuit configured to provide an output signal that is representative of the steepness of the slope of the measurement signal and further configured to signal a steepness higher than a predefined threshold.

2. The semiconductor device of claim 1, wherein the temperature sensor arrangement further comprises:
   a first temperature sensor that is arranged to provide a first temperature signal representative of a temperature present at the active area;
   a second temperature sensor that is arranged to provide a second temperature signal representative of a chip temperature present remote from the active area of the semiconductor chip; and
   a subtracting unit configured to provide the measurement signal, which is representative of a difference between the first temperature signal and the second temperature signal.

3. The semiconductor device of claim 1, wherein the evaluation circuit is configured to evaluate a rise time that it takes the measurement signal to rise by a predefined temperature increment and to signal a faulty state-of-operation when the rise time is below a predefined threshold.

4. The semiconductor device of claim 1, wherein the evaluation circuit is configured to evaluate an increment that the measurement signal rises within a predefined time period and to signal a faulty state of operation when the increment is above a predefined threshold.

5. The semiconductor device of claim 1, further comprising a control circuit that is configured to deactivate and/or to power down the semiconductor device when the evaluation circuit signals a faulty state of operation.

6. A method for operating a semiconductor device that comprises a semiconductor chip including an active area, the method comprising:
   providing a measurement signal dependent on a temperature in or close to the active area, the measurement signal having a slope of a time-dependent steepness;
   evaluating the measurement signal to provide an output signal that is representative of the steepness of the slope of the measurement signal; and
   signaling a faulty state of operation of the semiconductor device if the steepness of the slope of the measurement signal is higher than a predefined threshold.

7. The method of claim 6, wherein providing the measurement signal further comprises:
   measuring a first temperature representative of a temperature present at the active area; and
   measuring a chip temperature remote from the active area of the semiconductor chip;
   wherein the measurement signal is representative of a difference between the first temperature and the chip temperature.

8. The method of claim 6, wherein evaluating the measurement signal further comprises:
   evaluating a rise in time that it takes the measurement signal to rise by a predefined temperature increment; and
   signaling a faulty state-of-operation when the rise time is below a predefined threshold.

9. The method of claim 6, wherein evaluating the measurement signal further comprises:
   evaluating an increment that the measurement signal rises within a predefined time period; and
   signaling a faulty state of operation when the increment is above a predefined threshold.

10. The method of claim 6, further comprising:
   deactivating and/or powering down the semiconductor device in response to a signal indicating a faulty state of operation.

11. A semiconductor device comprising:
   a semiconductor chip including an active area;
   means for providing a measurement signal dependent on a temperature in or close to the active area, the measurement signal having a slope of a time-dependent steepness; and
   means for providing an output signal representative of the steepness of the slope of the measurement signal and for signaling a steepness higher than a predefined threshold.

12. The semiconductor device of claim 11, wherein the means for providing a measurement signal comprises:
   means for measuring a first temperature signal representative of a temperature present at the active area;
   means for measuring a second temperature signal representative of a chip temperature remote from the active area of the semiconductor chip; and
   means for determining a difference between the first and the second temperature signal.

13. The semiconductor device of claim 11, wherein the means for providing an output signal comprises means for evaluating a rise in time that it takes the measurement signal to rise by a predefined temperature increment and for signaling a faulty state-of-operation when the rise in time is below a predefined threshold.

14. The semiconductor device of claim 11, wherein the means for providing an output signal comprises means for evaluating an increment that the measurement signal rises within a predefined time period and for signaling a faulty state of operation when the increment is above a predefined threshold.

15. The semiconductor device of claim 14, further comprising means for deactivating the semiconductor device when the increment is above the predefined threshold.

16. The semiconductor device of claim 14, further comprising means for powering down the semiconductor device when the increment is above the predefined threshold.

* * * * *